(12) United States Patent
Liu et al.

(10) Patent No.: US 8,319,252 B2
(45) Date of Patent: Nov. 27, 2012

(54) LIGHT EMITTING DEVICE WITH HIGH COLOR RENDERING INDEX AND HIGH LUMINESCENCE EFFICIENCY

(75) Inventors: Wen-Huang Liu, Hsinchu (TW); Trung Tri Doan, Hsinchu (TW); Chuong Anh Tran, Hsinchu (TW)

(73) Assignee: Seminéds Optoelectronics Co., Ltd., Chu-Nan (TW)

( * ) Notice: Subject to any disclaimer, the term of this patent is extended or adjusted under 35 U.S.C. 154(b) by 368 days.

(21) Appl. No.: 12/690,828

(22) Filed: Jan. 20, 2010

(65) Prior Publication Data
US 2010/0264432 A1    Oct. 21, 2010

(30) Foreign Application Priority Data
Apr. 15, 2009  (TW) .............................. 98112514 A

(51) Int. Cl.
*H05B 41/16*    (2006.01)
(52) U.S. Cl. ......................................... 257/103; 257/98
(58) Field of Classification Search .................... 257/98, 257/99, 103
See application file for complete search history.

(56) References Cited

U.S. PATENT DOCUMENTS

| | | | |
|---|---|---|---|
| 2002/0070681 A1* | 6/2002 | Shimizu et al. | 315/246 |
| 2007/0146639 A1* | 6/2007 | Conner | 353/20 |
| 2008/0048193 A1* | 2/2008 | Yoo et al. | 257/89 |
| 2008/0151143 A1* | 6/2008 | Li et al. | 349/68 |

* cited by examiner

*Primary Examiner* — Thomas L Dickey
(74) *Attorney, Agent, or Firm* — Martine Penilla Group, LLP.

(57) ABSTRACT

A light emitting device comprises two light-emitting diode (LED) groups, a group of luminophor layers, and an input terminal. The first LED group includes at least one blue LED emitting light having a dominant wavelength in a range between 400 nm and 480 nm, and the second LED group includes at least one red-orange LED emitting light having a dominant wavelength in a range between 610 nm and 630 nm. The group of luminophor layers, which are selected from one of silicates, nitrides, and nitrogen oxides, are positioned above the first LED group and partially converts the light emitted by the first LED group into light having a dominant wavelength in a range between 500 nm and 555 nm. The input terminal is connected to the two LED groups for providing desired electric energy thereto.

39 Claims, 13 Drawing Sheets

LIGHT EMITTING DEVICE WITH HIGH COLOR RENDERING INDEX AND HIGH LUMINESCENCE EFFICIENCY

CLAIM OF PRIORITY

This application claims the priority benefit of Taiwan Application Serial Number 98112514, filed on Apr. 15, 2009. All disclosure of the Taiwan application is incorporated herein by reference.

BACKGROUND OF THE INVENTION

1. Field of the Invention

The present invention relates to an LED (light-emitting diode) light emitting device. Preferably, the present invention relates to an LED light emitting device with high color rendering index (hereinafter, CRI) and high luminescence efficiency.

2. Description of Related Art

In recent years, blue light LEDs are often combined with fluorescent materials to produce light emitting devices which can emit white light. Such light emitting devices are often used as backlight sources of LCD monitors, traffic signals, illuminated switches, or indicators. Moreover, since the LEDs taken as light sources in the light emitting devices only require a low current to operate, the light emitting devices can considerably reduce the energy consumed in comparison with conventional incandescent lamps or fluorescent lamps. In addition, light emitting devices using LEDs as light sources can have a longer service life than that of conventional incandescent lamps or fluorescent lamps.

FIG. 1 is a schematic diagram showing a conventional light emitting device employing a combination of a blue light LED and a fluorescent material. A blue light LED 102 is disposed on a substrate 101, and an input terminal 105 is connected to the blue light LED 102 for providing electric energy to the light emitting device. The blue light LED 102 is covered with a layer of fluorescent material coating 103 (yttrium aluminum garnet, YAG). Furthermore, the light emitting device is covered with a transparent hemispherical enclosure 104 to protect the blue light LED 102 and the fluorescent material coating 103 therein from the influence of moisture. However, such light emitting device lacks a red waveband (wavelength ranging from 600 nm to 650 nm approximately), so that the CRI of the emitted light is low. It should be understood that, as is well known and accepted, CRI is a relative difference between the color of a specimen under the illumination of a light emitting device and the color of the specimen under the illumination of a black-body radiator. When CRI is 100, the color of the specimen under the illumination of the light emitting device is substantially the same as the color of the specimen under the illumination of the black-body radiator.

Referring back to the light emitting device in FIG. 1, it is assumed that the fluorescent material coating 103 employs a mixed fluorescent material containing fluorescent materials capable of being excited by the blue light LED 102 and respectively emitting red light and green light. Although the mixed fluorescent material can improve the CRI of the light emitting device, the green light excited by the blue light LED 102 is reabsorbed by the material capable of emitting red fluorescent light, which causes the luminescence efficiency (i.e. lumens per watt, lumens/W) of green light to decrease, and thus the luminescence efficiency of the entire light emitting device is affected.

For the problem of the low CRI of the conventional light emitting device, an LED capable of emitting light with a dominant wavelength in a range between 430 nm and 480 nm is covered with a fluorescent material (Cerium-doped YAG, YAG:Ce) capable of emitting light with a dominant wavelength ranging from 555 nm to 585 nm, while an LED capable of emitting light with a dominant wavelength ranging from 600 nm to 630 nm is added to the light emitting device. Therefore, a red waveband lacking in the conventional light emitting device can be supplemented, thereby increasing the CRI of the emitted light to 80. However, the luminescence efficiency of the light emitting device is still low (refer to Table 1).

BRIEF SUMMARY OF THE INVENTION

The present invention is designed in full consideration of the situation above. The object of the present invention is to provide an improved light emitting device which has a high CRI while increases the luminescence efficiency. A detailed description will be given below.

Furthermore, retinas, which include rod cells and cone cells, are the main photosensitive portion of a human eye system. The visual condition of human eyes changes as the environmental brightness varies. When being in a bright environment with a brightness more than 3 cd/m$^2$, the human eye vision is mainly activated by the cone cells, which results in a contraction of pupils and a small angle of visual field. It is easy to recognize the details of an object and sense colors under such visual state, so it is called a photopic vision. When being in an environment with a brightness less than 0.001 cd/m$^2$, the human eye vision is mainly activated by the rod cells, which results in a dilation of pupils and a large angle of visual field. It is merely able to notice the profile of an object without recognizing the details of the object or sensing colors under such visual state, so it is called a scotopic vision. A vision in a brightness range between 0.001 cd/m$^2$ and 3 cd/m$^2$ is called a mesopic vision (a visual state between the photopic vision and the scotopic vision), wherein the rod cells and the cone cells are both active and determine the response characteristics of human eye spectral sensitivity together. The main application of a light source under a mesopic visual state is night lightings. The present invention optimizes the spectral power distribution by mixing the colors of light, thereby having a better light source under the mesopic vision state, and being closer to an actual illuminative environment to realize an optimization of light color and color rendering.

The present invention provides a light emitting device, comprising two LED groups, a group of luminophor layers, and an input terminal. The first LED group includes at least one blue LED which can emit light with a dominant wavelength in a range between 400 nm and 480 nm, and the second LED group includes at least one red-orange LED which can emit light with a dominant wavelength in a range between 610 nm and 630 nm. The group of luminophor layers, which are selected from one of silicates, nitrides, and nitrogen oxides, are positioned above the first LED group and partially converts the light emitted by the first LED group into light with a dominant wavelength in a range between 500 nm and 555 nm. The Input terminal is connected to the two LED groups to provide desired electric energy thereto. Therefore, a red waveband lacking in conventional light emitting devices can be supplemented, thereby increasing the CRI of the emitted light to 80. Furthermore, the luminescence efficiency of the light emitting device according to the present invention can be higher than conventional light emitting devices. It should be understood by those skilled in the art that, as is well known and accepted, a "dominant wavelength" is a perceived color of the spectrum, namely, a single light wavelength producing a color sense that is most similar to the color sense perceived from a visible light source.

Other objects and advantages of the present invention will become more apparent from the following description of several embodiments and accompanying drawings.

BRIEF DESCRIPTION OF THE DRAWINGS

The present invention will easily be understood with reference to the following description and accompanying drawings, and similar constituent elements are given the same reference numerals.

DETAILED DESCRIPTION OF THE PREFERRED EMBODIMENTS

The present invention will be described with reference to the accompanying drawings, which are taken as a part of the detailed description.

A number of specific embodiments are set forth to provide a thorough understanding of the present invention. However, it is obvious for those skilled in the art that not part or all of these specific details are necessary for practicing the present invention. In other examples, operations that are already known will not be further described to avoid any confusion.

Figure 1:
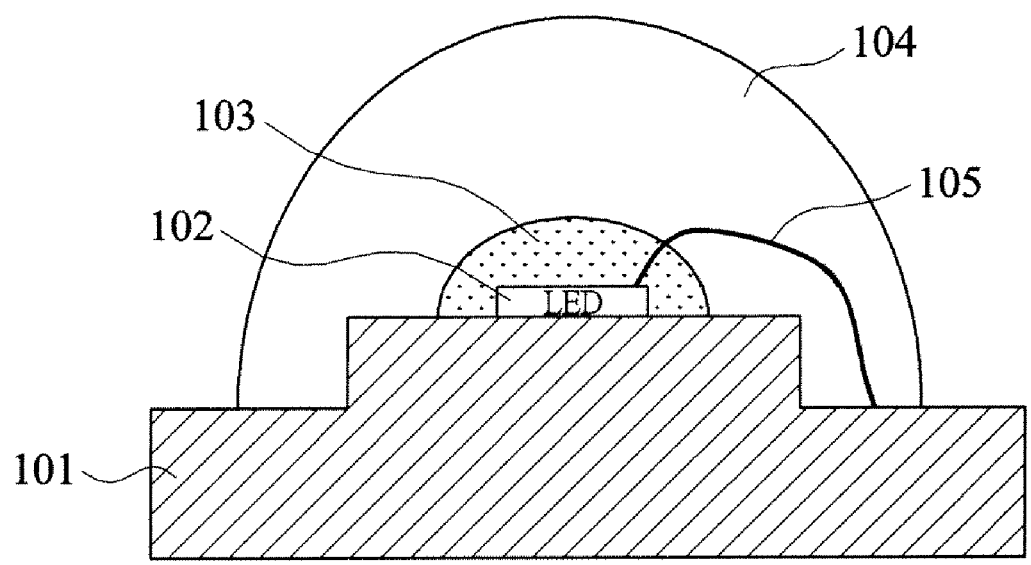
FIG. 1 is a schematic view showing a conventional light emitting device employing a combination of a blue LED and a mixed fluorescent material.
Figure 2A:
FIG. 2A is a cross-sectional view showing a light emitting device according to an embodiment of the present invention.
Figure 2A:
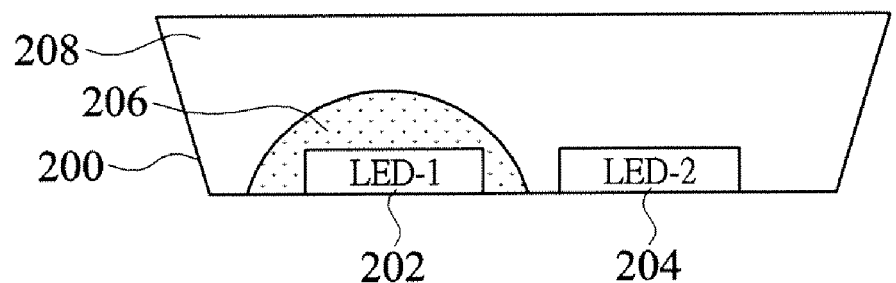

FIG. 2A is a cross-sectional view showing a light emitting device according to an embodiment of the present invention. The number 200 represents a concave structure with a reflective inner surface (hereinafter, a reflection cup). A first LED group 202 and a second LED group 204 are disposed in the reflection cup 200. The first LED group 202 includes at least one blue light LED which can emit light with a dominant wavelength in a range between 400 nm and 480 nm; and the second LED group 204 includes at least one red-orange LED which can emit light with a dominant wavelength in a range between 610 nm and 630 nm.

Next, an input terminal (not shown) is connected to the first LED group 202 and the second LED group 204 respectively, to provide the desired electric energy to the first LED group 202 and the second LED group 204. A group of luminophor layers 206, which are selected from one of silicates, nitrides, and nitrogen oxides, are coated on the first LED group. The luminophor layer 206 can be a single luminophor layer or multiple luminophor layers, and the surface thereof can be hemispherical, convex, or planar. The luminophor layer 206 can be excited by the light emitted by the first LED group 202, thereby emitting a fluorescence with a dominant wavelength ranging from 500 nm to 555 nm. The luminophor layer 206 is formed by at least one of spraying, dispensing, spin-coating, injecting, molding, adhering, and printing.

Figure 3A:
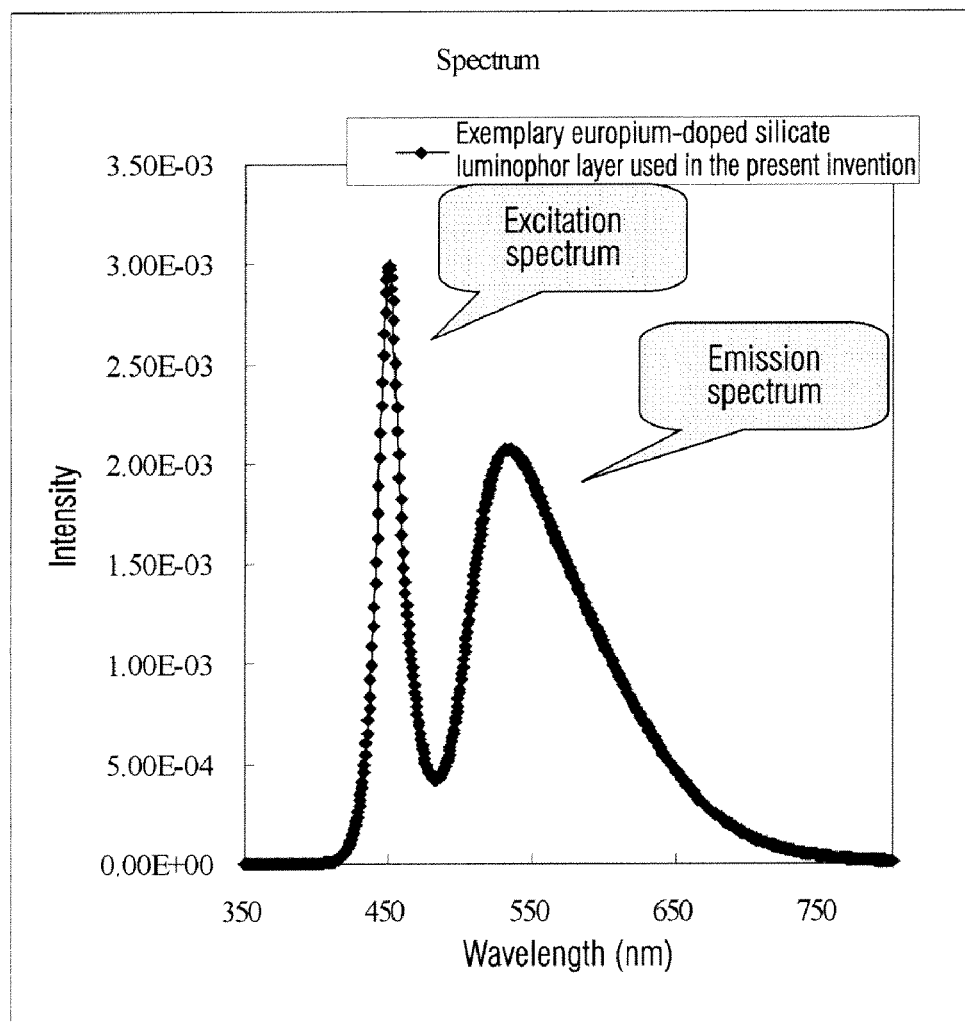
FIG. 3A is an optical spectrum of an exemplary europium-doped silicate luminophor layer used in the present invention.
Figure 3B:
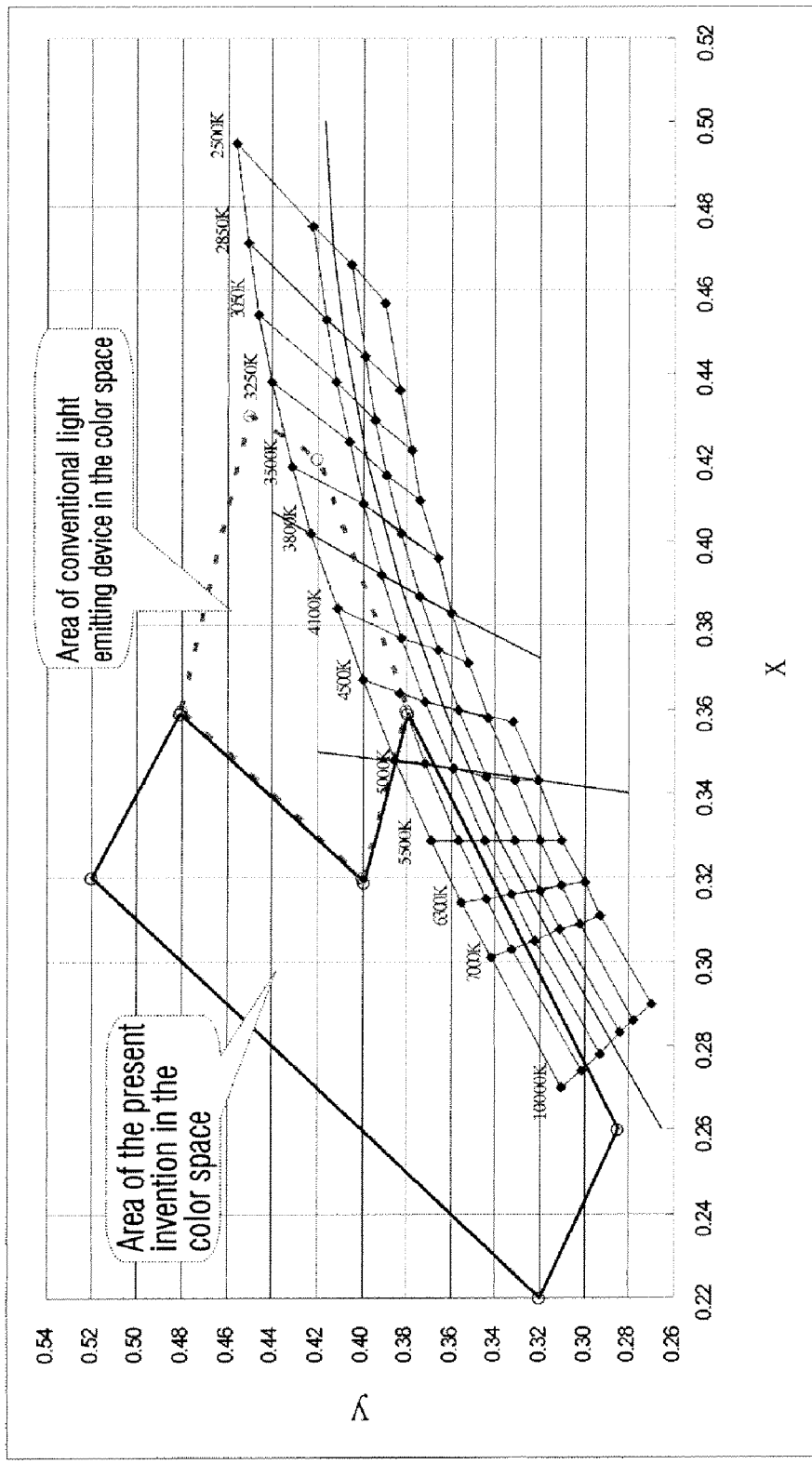
FIG. 3B illustrates a comparison of the light emitting device of the present invention and a conventional light emitting device in the CIE 1931 color space.

FIG. 3A illustrates the optical spectrum of an exemplary europium-doped silicate luminophor layer used in the present invention. In this exemplary embodiment of an europium-doped silicate, a mixed fluorescent material, which includes LP-F520 produced by Leuchtstoffwerk Breitungen GmbH and O5446™ produced by Intermatix Company, is employed. Alternatively, the luminophor layer can be selected from one of silicates, nitrides, and nitrogen oxides, such as $(Ba, Sr, Ca)_2SiO_4:Eu$, $Ca_{0.995}YB_{0.005}Si_9Al_3ON_{15}$, or $Ba_3Si_6O_{12}N_2:Eu^{2+}$. FIG. 3B illustrates a light mixture of the light emitted by the first LED group 202 and the fluorescence emitted by the excited luminophor layer 206. The light mixture falls in an area constructed of six point coordinates and six line segments in the CIE 1931 color space. The six point coordinates in the CIE 1931 color space are sequentially a first point (0.359, 0.481), a second point (0.320, 0.520), a third point (0.220, 0.320), a fourth point (0.260, 0.285), a fifth point (0.359, 0.379), and a sixth point (0.319, 0.399). The six line segments include a first line segment connecting the first point and the second point, a second line segment connecting the second point and the third point, a third line segment connecting the third point and the fourth point, a fourth line segment connecting the fourth point and the fifth point, a fifth line segment connecting the fifth point and the sixth point, and a sixth line segment connecting the sixth point and the first point.

FIG. 3B also shows the area of a sub-mixture of light (i.e. a light mixture of the blue light LED and the YAG:Ce fluorescent layer thereon) disclosed by the conventional light emitting device in the CIE 1931 color space. As shown in FIG. 3B, the area of the sub-mixture of light of the present invention locates on the left side of the area of the sub-mixture of light of the conventional light emitting device. Those skilled in the art will understand that such result means the luminescence efficiency of the present invention being higher than that of the above conventional light emitting device. The result is also shown in the following Table 1.

Next, referring again to FIG. 2A, a transparent layer 208 can be configured to cover the first LED group 202, the second LED group 204, and the luminophor layer 206, to prevent these elements from the influence of moisture. The transparent layer 208 can include at least one of a transparent polymeric material (such as epoxy, silicone, polyimide, acryl, polycarbonate (PC), or parylene), and a transparent material such as quartz or glass. Further, the structure of the transparent layer 208 can be single-layered or multi-layered.

Figure 2B:
FIG. 2B is a cross-sectional view showing another light emitting device according to an embodiment of the present invention.
Figure 2B:
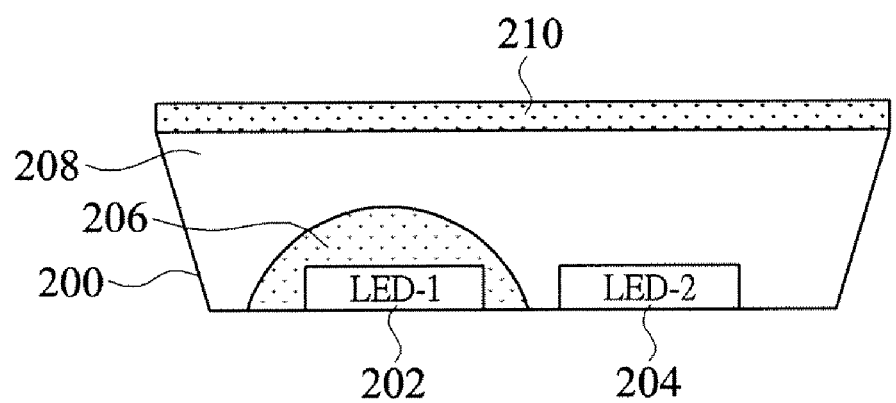

FIG. 2B illustrates coating a diffusion layer on the structure shown in FIG. 2A, i.e. coating a diffusion layer 210 on the transparent layer 208, for enabling the light emitted by the first LED group 202 and the second LED group 204 to mix with the light emitted by the excited luminophor layer 206 more uniformly and emit white light. Further, another function of the transparent layer 208 is to enable the light reflected from the interface of the transparent layer 208 and materials thereon (such as the diffusion layer 210) due to a difference between refractive indices or the influence of interlayer grain molecules to be directed to the reflective inner surface of the reflection cup 200 more possibly, but not to be absorbed by the first group of luminophor layers 206 or the second LED group 204, thereby improving the luminescence efficiency. In addition, the reflection cup 200 can refract the light emitted by an LED or the light reflected from structural interfaces of the LED to an exit direction (as shown by the arrow), thereby increasing the luminescence efficiency.

Figure 4:
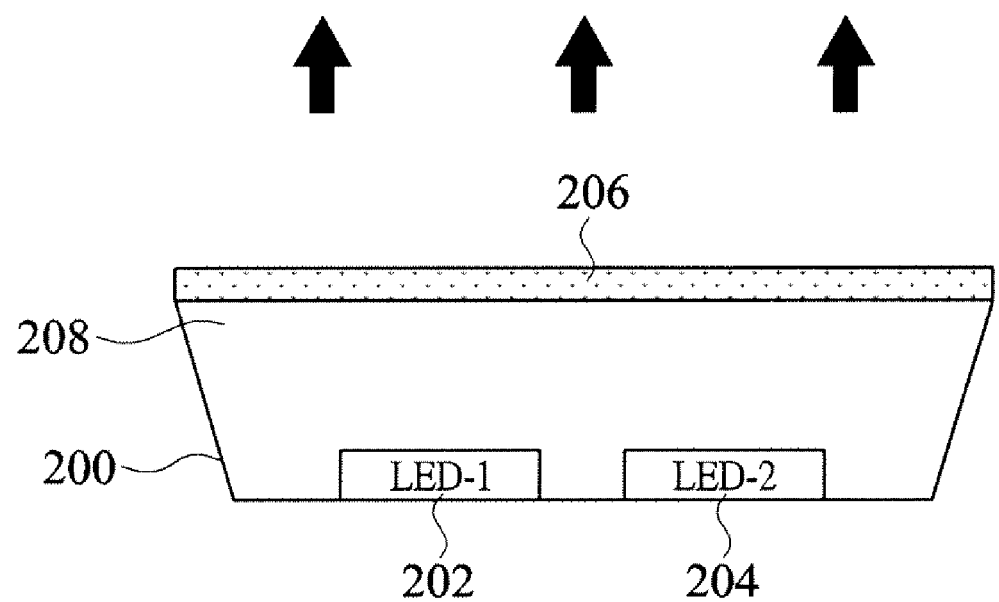
FIG. 4 is a cross-sectional view showing another light emitting device according to an embodiment of the present invention.

In FIG. 4, the reflection cup 200 is covered with the transparent layer 208 after disposing the first LED group 202 and the second LED group 204 on the reflection cup 200, followed by disposing the luminophor layer 206 on the transparent layer 208 to cover the transparent layer 208, the first LED group 202, and the second LED group 204. The luminophor layer 206 is excited only by the light emitted by the first LED group 202 to emit a fluorescence with a dominant wavelength in a range between 500 nm and 555 nm, and the luminophor layer 206 is only used for diffusion for the second LED group 204. Therefore, a light emitting device of an uniformly mixed white light can also be obtained.

Figure 5:
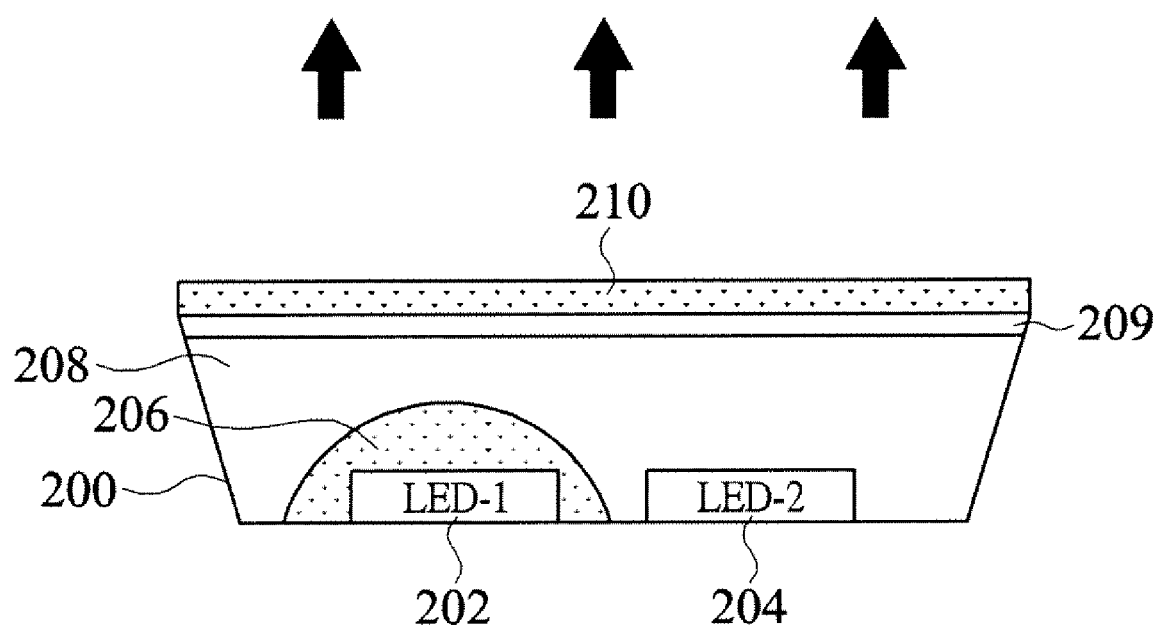
FIG. 5 is a cross-sectional view showing another light emitting device according to an embodiment of the present invention.

FIG. 5 is a cross-sectional view showing another light emitting device according to an embodiment of the present invention. The difference compared to the light emitting device in FIG. 2B is adding an anti-reflective coating (ARC) 209 between the transparent layer 208 and the diffusion layer 210. The ARC 209 can be formed by employing at least one of spin-coating, dip-coating, chemical vapor deposition (CVD), thermal evaporation coating, and e-beam evaporation coating. The ARC 209 can include but is not limited to a transparent layer of at least one of e.g. nitrocellulose, cellulose esters, cellulose acetate, cellulose acetate butyrate, Teflon, Cytop, $SiO_2$, $SiN_x$, $SiO_xN_y$, $TiO_2$, $MgO$, and $MgF_2$. The ARC 209 can be configured to let the light produced in the reflection cup 200 (including the light emitted by the first LED group 202 and the second LED group 204, the light emitted by the excited luminophor layer 206, and the light reflected from the reflection cup 200) pass through, and enable the scattering light in the diffusion layer 210 affected by the interlayer grain molecules to be refracted back to the exit direction (as shown by the arrow) on the interface between the diffusion layer 210 and the ARC 209, thereby increasing the luminescence efficiency of the light emitting device.

Figure 6:
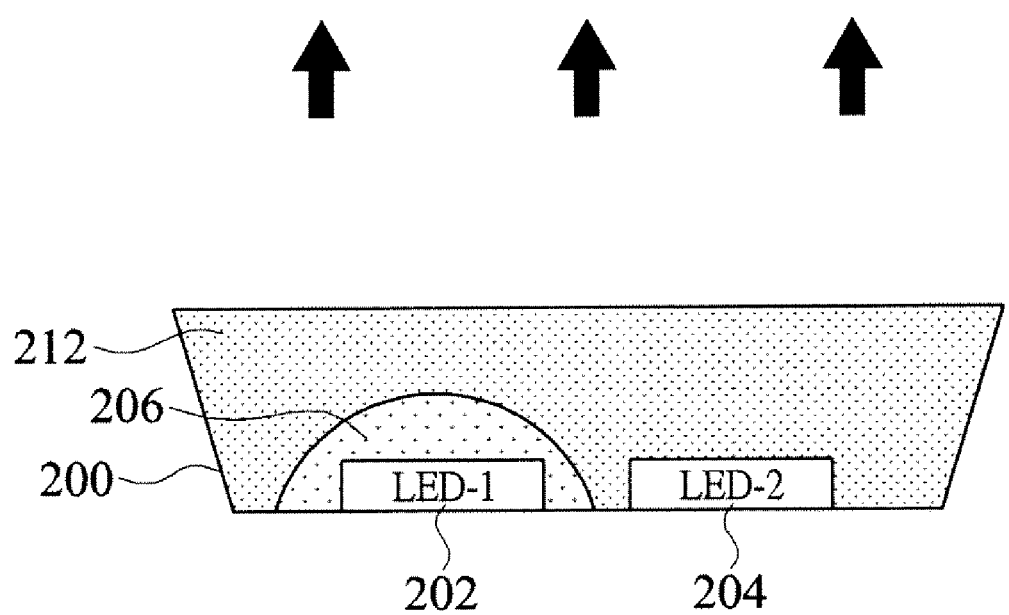
FIG. 6 is a cross-sectional view showing another light emitting device with a diffusion layer and a transparent layer according to an embodiment of the present invention.

Also, as shown in FIG. 6, a diffusion layer 212 with a coating function can be formed by combining the transparent layer 208 and the diffusion layer 210 in FIG. 2B, for protecting the first LED group 202, the second LED group 204, and the luminophor layer 206 in the reflection cup 200, while more uniformly mixing the light emitted by the first LED group 202 and the second LED group 204 with the fluorescence emitted by the excited luminophor layer 206 to produce white light.

Figure 7A:
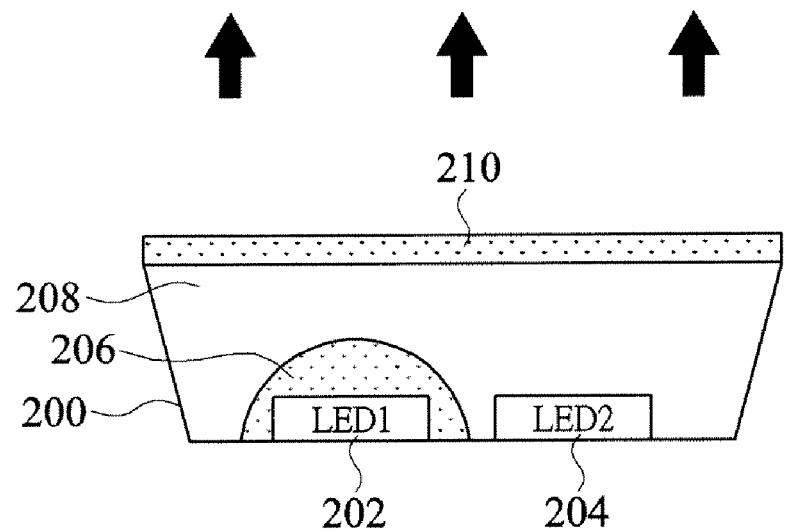
FIG. 7A is a cross-sectional view showing that the first and the second LED groups according to an embodiment of the present invention have two LED units respectively.
Figure 7B:
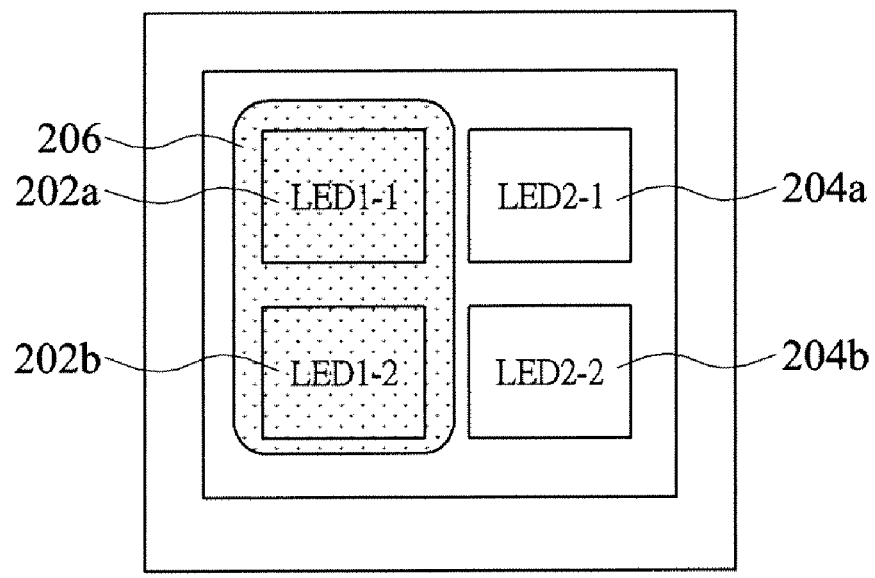
FIG. 7B is a top view of the structure shown in FIG. 7A.

It should be understood that one or more LED units can be disposed in each of the first LED group and the second LED group of the light emitting device of the present invention according to operational requirements and purposes. In other words, each of the two LED groups can be provided with more than one LED unit. FIG. 7A is a cross-sectional view showing that the first and the second LED groups according to an embodiment of the present invention have two LED units respectively. FIG. 7B is a top view of the structure shown in FIG. 7A. As shown in FIG. 7A, a first LED group 202 and a second LED group 204 are disposed in a concave structure with a reflective inner surface (hereinafter, a reflection cup) 200. As shown in FIG. 7B, the first LED group 202 includes two LED units 202a and 202b; and the second LED group 204 includes two LED units 204a and 204b. The first LED group 202 includes at least one blue light LED capable of emitting light with a dominant wavelength in a range between 400 nm and 480 nm, while the second LED group 204 includes at least one red-orange LED emitting light with a dominant wavelength in a range between 610 nm and 630 nm It should be appreciated that only two LED units are shown in each of the LED groups in the light emitting device in FIGS. 7A and 7B, but the light emitting device is not limited thereto, that is, each of the LED groups can be provided with one or more LED units. Additionally, the sizes of the plurality of LED units in each of the LED groups can be the same or different from one another.

Next, an input terminal is connected to the first LED group 202 and the second LED group 204 respectively to provide a required electric energy to the first LED group 202 and the second LED group 204. A luminophor layer 206, selected from one of such as silicates, nitrides, and nitrogen oxides (e.g. $(Ba, Sr, Ca)_2SiO_4:Eu$, $Ca_{0.995}YB_{0.005}Si_9Al_3ON_{15}$, or $Ba_3Si_6O_{12}N_2:Eu^{2+}$), is coated on the first LED group 202. The luminophor layer 206 can be a single luminophor layer or multiple luminophor layers, and the surface thereof can be hemispherical, convex, or planar. Referring to FIG. 3B, the luminophor layer 206 can be excited by the light emitted by the first LED group 202, thereby emitting a fluorescence with a wavelength of a range between 500 nm and 555 nm. When mixing with the light having a dominant wavelength in a range between 400 nm and 480 nm emitted by the first LED group 202, the light mixture of the light emitted by the first LED group and the fluorescence emitted by the excited luminophor layer 206 falls in an area constructed of six point coordinates and six line segments in the CIE 1931 color space. The six point coordinates in the CIE 1931 color space are sequentially a first point (0.359, 0.481), a second point (0.320, 0.520), a third point (0.220, 0.320), a fourth point (0.260, 0.285), a fifth point (0.359, 0.379), and a sixth point (0.319, 0.399). The six line segments include a first line segment connecting the first point and the second point, a second line segment connecting the second point and the third point, a third line segment connecting the third point and the fourth point, a fourth line segment connecting the fourth point and the fifth point, a fifth line segment connecting the fifth point and the sixth point, and a sixth line segment connecting the sixth point and the first point.

Next, referring again to FIG. 7A, a transparent layer 208 can be configured to cover the first LED group 202, the second LED group 204, and the luminophor layer 206, to prevent these elements from the influence of moisture. The transparent layer 208 can include at least one of a transparent polymeric material (such as epoxy, silicone, polyimide, acryl, polycarbonate (PC), or parylene), and a transparent material such as quartz or glass. Further, the structure of the transparent layer 208 can be single-layered or multi-layered. Furthermore, a diffusion layer 210 on the transparent layer 208, for enabling the light emitted by the first LED group 202 and the second LED group 204 to mix with the light emitted by the excited luminophor layer 206 more uniformly and emit white light. Further, another function of the transparent layer 208 is to enable the light reflected from the interface of the transparent layer 208 and materials thereon (such as the diffusion layer 210) due to a difference between refractive indices or an influence of interlayer grain molecules to be directed to the reflective inner surface of the reflection cup 200 more possibly, but not to be absorbed by the luminophor layer 206 or the second LED group 204, thereby improving the luminescence efficiency. In addition, the reflection cup 200 can refract the light emitted by an LED or the light reflected from structural interfaces of the LED to an exit direction (as shown by the arrow), thereby increasing the luminescence efficiency.

Additionally, the two LED groups in the light emitting device can be serially or parallelly connected according to operational purposes or requirements. In conjunction with adequate circuit designs, operation ICs and power supplies, the two LED groups can also be operated simultaneously or respectively with the same or different operation currents. The plurality of LED units in each of the LED groups can also be operated simultaneously or respectively with the same or different operation currents in conjunction with adequate circuit designs, operation ICs and power supplies.

Figure 8A:
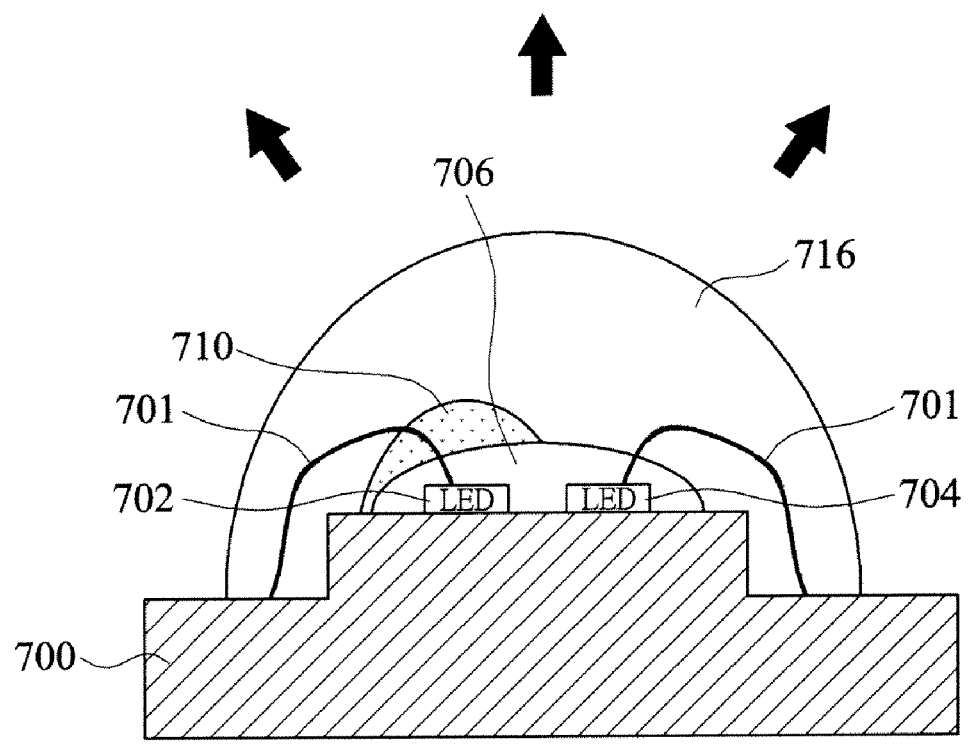
FIG. 8A is a cross-sectional view showing a light emitting device with an LED attached to the surface of a base according to an embodiment of the present invention.

Also, the present invention can be applied to a light emitting device of surface adhesive type LEDs. FIG. 8A is a cross-sectional view showing a light emitting device with an LED adhered to the surface of a base according to an embodiment of the present invention. A first LED group 702 and a second LED group 704 are adhered onto a base 700, wherein the base 700 can be semiconductors, metals, ceramics, or metal matrix composites (MMCs). A reflector (not shown) is disposed at an adherence position between the base 700 and the first and the second LED groups 702 and 704. As described above, the reflector is able to refract the light emitted by an LED or the light reflected in a structural interface on the LED to an exit direction (as shown by the arrow), thereby increasing the luminescence efficiency. The first LED group 702 includes at least one blue light LED capable of emitting light with a dominant wavelength in a range between 400 nm and 480 nm, while the second LED group 704 includes at least one red-orange LED emitting light with a dominant wavelength in a range between 610 nm and 630 nm As the abovementioned description, the first LED group 702 and the second LED group 704 can be provided with one or more LED units respectively for operational requirements and purposes. In addition, the sizes of the plurality of LED units in each of the LED groups can be the same or different from one another.

Next, an input terminal 701 is connected to the first LED group 702 and the second LED group 704 respectively to provide a required electric energy to the first LED group 702 and the second LED group 704. A transparent layer 706 can be configured to be coated on the first LED group 702 and the second LED group 704 to prevent these elements from the influence of moisture. The transparent layer 706 can include at least one of a transparent polymeric material (such as epoxy, silicone, polyimide, acryl, polycarbonate (PC), or parylene), and a transparent material such as quartz or glass. In addition, the structure of the transparent layer 706 can be single-layered or multi-layered, while the transparent layer 706 can be hemisphere, convex, tapered, or Fresnel-lens-shaped, and an adequate shape is selected to achieve a best extraction of the light emitted by the first LED group 702 and the second LED group 704.

A luminophor layer 710, selected from one of such as silicates, nitrides, and nitrogen oxides (e.g. $(Ba, Sr, Ca)_2SiO_4$:Eu, $Ca_{0.995}YB_{0.005}Si_9Al_3ON_{15}$, or $Ba_3Si_6O_{12}N_2:Eu^{2+}$), is coated on the transparent layer 706 at a position corresponding to the first LED group 702. The luminophor layer 710 can be a single luminophor layer or multiple luminophor layers, and can be hemispherical, convex, or planar. Referring to FIG. 3B, the luminophor layer 710 is excited by the light emitted by the first LED group 702, thereby emitting a fluorescence having a wavelength of a range between 500 nm and 555 nm. When mixing with the light having a dominant wavelength in a range between 400 nm and 480 nm emitted by the first LED group 702, the light mixture of the light emitted by the first LED group 702 and the fluorescence emitted by the excited luminophor layer 710 falls in an area constructed of six point coordinates and six line segments in the CIE 1931 color space. The six point coordinates in the CIE 1931 color space are sequentially a first point (0.359, 0.481), a second point (0.320, 0.520), a third point (0.220, 0.320), a fourth point (0.260, 0.285), a fifth point (0.359, 0.379), and a sixth point (0.319, 0.399). The six line segments include a first line segment connecting the first point and the second point, a second line segment connecting the second point and the third point, a third line segment connecting the third point and the fourth point, a fourth line segment connecting the fourth point and the fifth point, a fifth line segment connecting the fifth point and the sixth point, and a sixth line segment connecting the sixth point and the first point.

Further, another function of the transparent layer 706 is to enable the light reflected from the interface of the transparent layer 706 and materials thereon (such as the luminophor layer 710) due to a difference between refractive indices or an influence of interlayer grain molecules to be directed to the reflector of the base 700 more possibly, but not to be absorbed by the first LED group 702 or the second LED group 204, thereby improving the luminescence efficiency.

Furthermore, a transparent packaging layer 716 is configured to cover the first LED group 702, the second LED group 704, the transparent layer 706, the luminophor layer 710, and the input terminal 701, to prevent these elements from the influence of moisture. In addition, the transparent packaging layer 716 can be hemisphere, convex, tapered, or Fresnel-lens-shaped according to operational requirements and purposes. In other words, the shape of the transparent packaging layer 716 can be designed to maximize the light emitted by the first LED group 702, the second LED group 704, and the luminophor layer 710. The transparent packaging layer 716 can include at least one of a transparent polymeric material (such as epoxy, silicone, polyimide, acryl, polycarbonate (PC), or parylene), and a transparent material such as quartz or glass. Further, the structure of the transparent packaging layer 716 can be single-layered or multi-layered.

Figure 8B:
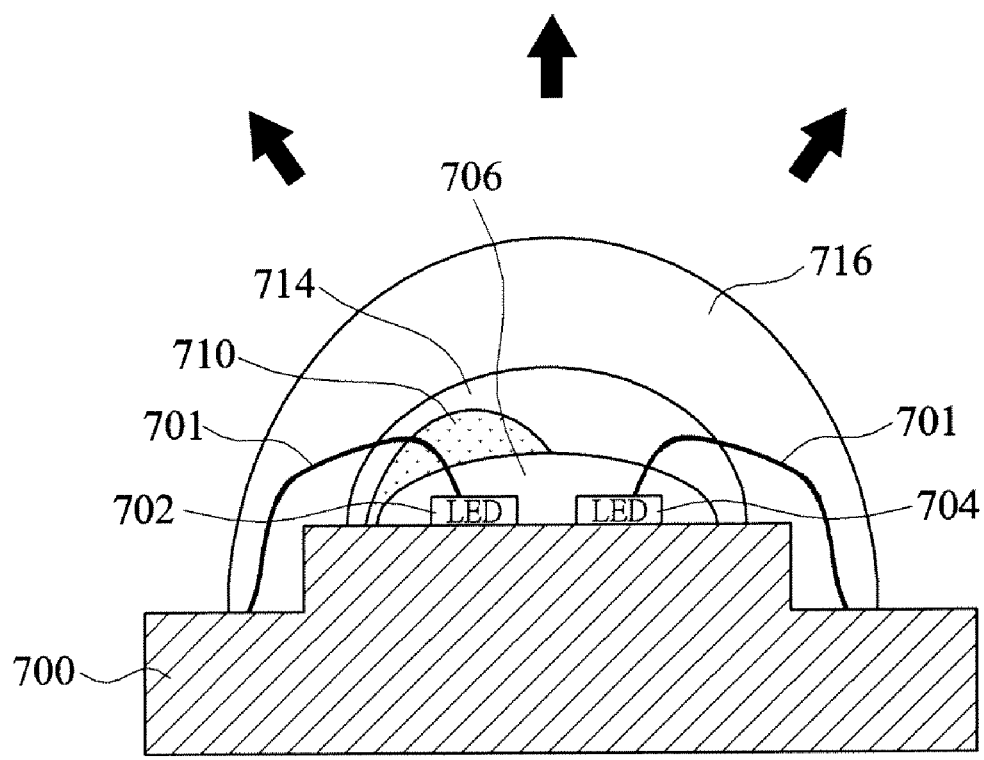
FIGS. 8B to 8E are cross-sectional views showing a derivative light emitting device based on the light emitting device shown in FIG. 8A according to an embodiment of the present invention.

FIGS. 8B to 8E are cross-sectional views showing a derivative light emitting device based on the light emitting device shown in FIG. 8A according to an embodiment of the present invention. In FIG. 8B, a diffusion layer 714 is firstly coated on the luminophor layer 710 described in FIG. 8A. Then the first LED group 702, the second LED group 704, the transparent layer 706, the luminophor layer 710, the diffusion layer 714 and the input terminal are coated with the transparent packaging layer 716 to prevent these elements from the influence of moisture. The function of the diffusion layer 714 is to more uniformly mix the light emitted by the first LED group 702 and the second LED group 704 with the fluorescence emitted by the excited luminophor layer 714, and produce white light.

Figure 8C:
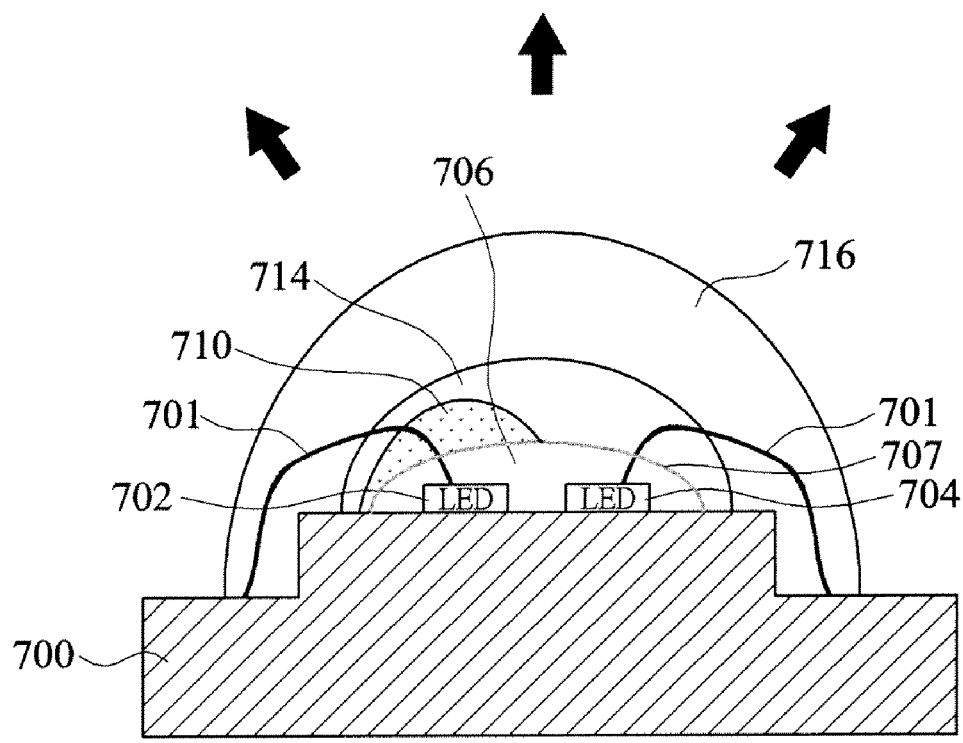

FIG. 8C illustrates that after coating the transparent layer 706 and before coating the first group of luminophor layers 710, an anti-reflective coating (ARC) 707 is formed on the transparent layer 706 by employing at least one of spin-coating, dip-coating, chemical vapor deposition (CVD), thermal evaporation coating, and e-beam evaporation coating. The ARC 707 can include but is not limited to a transparent layer of at least one of e.g. nitrocellulose, cellulose esters, cellulose acetate, cellulose acetate butyrate, Teflon®, Cytop, $SiO_2$, $SiN_x$, $SiO_xN_y$, $TiO_2$, MgO, and $MgF_2$. The ARC 707 can be configured to let the light in the coating area thereof (including the light emitted by the first LED group 702 and the second LED group 704, and the light reflected from the base 700) pass through, and enable the scattering light in the luminophor layer 710 or the diffusion layer 714 affected by the interlayer grain molecules to be refract again back to the exit direction (as shown by the arrow) on the interface between the luminophor layer 710 (or the diffusion layer 714) and the ARC 707, thereby increasing the luminescence efficiency of the light emitting device.

Figure 8D:
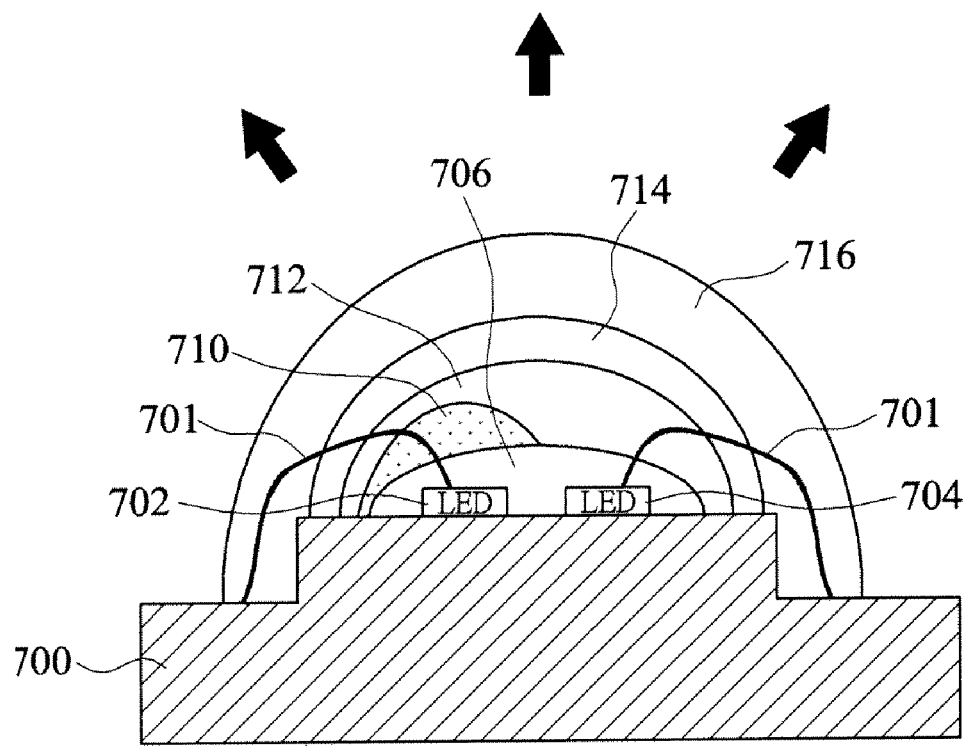

FIG. 8D illustrates coating a transparent layer 712 between the abovementioned luminophor layer 710 and the diffusion layer 714. The transparent layer 712 not only can further protect the luminophor layer 710 and structures thereunder from the influence of moisture, but also can enable the light reflected from the interface of the transparent layer 712 and materials thereon (such as the diffusion layer 714) due to a difference between refractive indices or an influence of interlayer grain molecules to be directed to the reflective inner surface of the reflection cup 200 more possibly, but not to be absorbed by the luminophor layer 710, thereby improving the luminescence efficiency. The transparent layer 712 can include at least one of a transparent polymeric material (such as epoxy, silicone, polyimide, acryl, polycarbonate (PC), or parylene), and a transparent material such as quartz or glass. In addition, the structure of the transparent layer 712 can be single-layered or multi-layered. The transparent layer 712 can be hemisphere, convex, tapered, or Fresnel-lens-shaped, and an adequate shape thereof is selected according to operational requirements and purposes to achieve a best extraction of the light emitted by the first LED group 702, the second LED group 704, and the luminophor layer 710.

Figure 8E:
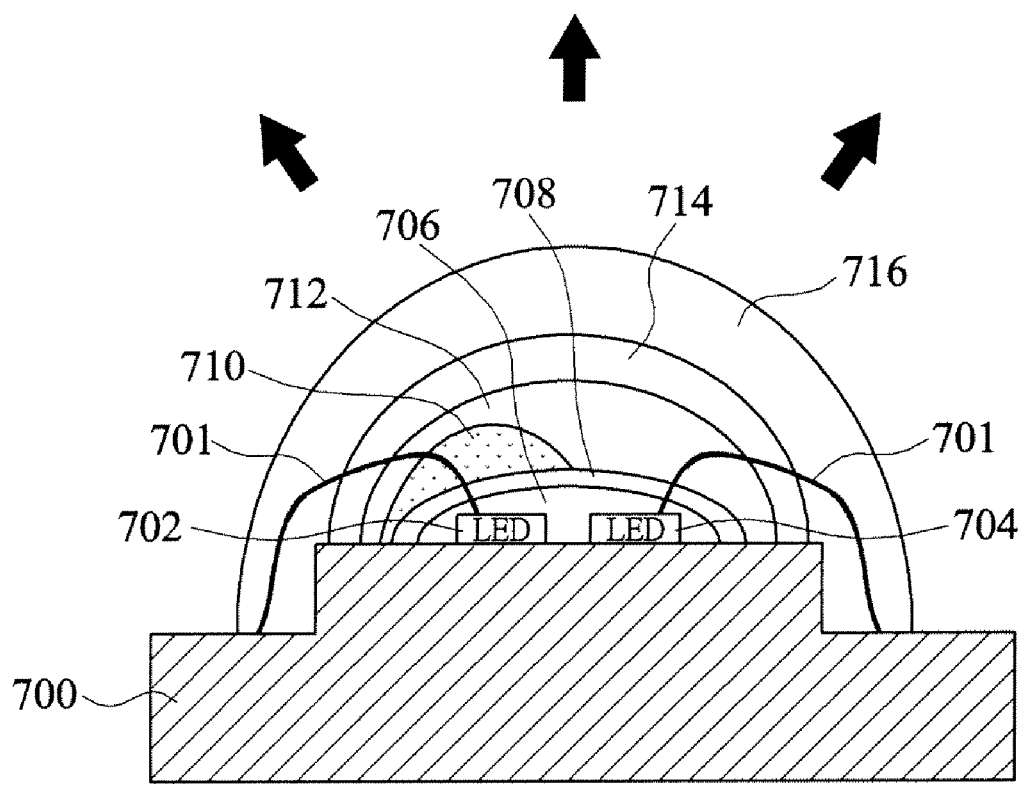

FIG. 8E illustrates forming a hollow layer 708 between the transparent layer 706 and the luminophor layer 710. The hollow layer 708 may comprise air. In consideration of reliability, the hollow layer 708 can further comprise $N_2$, Ar, or other inert gases. The thickness of the hollow layer 708 is in a range between 0.01 mm and 10 mm. Since the refraction index of the hollow layer 708 is approximately 1 (the refraction indices of air, $N_2$, Ar, or other inert gases are approximately 1), and the refraction index of the luminophor layer 710 is approximately 1.5, those skilled in the art should understand that a total reflection will not occur when the light from the from the hollow layer 708 enters the luminophor layer 710. Thus, the hollow layer 708 is configured to let the light emitted by the first LED group 702 completely pass through the interface between the hollow layer 708 and the luminophor layer 710. On the other hand, the light scattering back from the luminophor layer 710 can easily cause a total reflection due to the difference between refraction indices of the hollow layer 708 and the luminophor layer 710, thereby increasing the entire luminescence efficiency of the light emitting device.

Those skilled in the art will understand that the hollow layer 708, the transparent layer 712 and the diffusion layer 714 described in FIGS. 8B to 8E can be configured or omitted according to operational requirements and purposes. In other words, the embodiments in the specific description should not be understood as implying that these structures must simultaneously exist in the light emitting device of the present invention.

Table 1 is a comparison in CRIs and luminescence efficiencies of conventional LED light emitting devices and the LED light emitting device of the present invention, wherein each aspect is measured under blue light LEDs of the same brightness and wavelength, the same packaging type, the same resin, and the same integrating sphere measurement. It is to be appreciated that although the luminophor layer in aspect 5 (i.e. the present invention) employs europium-doped silicates, the present invention is not limited to such silicate, and can employ other luminophor layers of e.g. nitrides or nitrogen oxides.

While the invention has been described in terms of several exemplary embodiments, those skilled in the art will recognize that the invention can be practiced with various substitutions, additions, modifications and equivalent operations. Therefore, the present invention encompasses all of the substitutions, additions, modifications and equivalent operations that fall within the real spirit and scope of the appended claims and the invention is not limited to the examples described above.

TABLE 1

| Item | Aspect (Condition: blue light LEDs of the same brightness and wavelength, the same packaging type, the same resin, and the same integrating sphere measurement) | CRI | Color temperature (K) | Luminescence Efficiency (lumens/W) | Ratio of Brightness Enhancement (%) |
|---|---|---|---|---|---|
| 1 | Blue light LED + YAG | 75 | 6000 | 87.21 | 100% |
| 2 | Blue light LED + YAG + red fluorescent layer | 80 | 2750 | 55.36 | 63.51% |
| 3 | Blue light LED + YAG + red-orange fluorescent layer | 80 | 2750 | 62 | 71.1% |
| 4 | Blue light LED + YAG:Ce + red light LED | >80 | 2750 | 78.45 | 90% |
| 5 | Blue light LED + europium-doped silicate + red-orange light LED (the present invention) | >80 | 2750 | 81.7 | 93.7% |

The invention claimed is:

1. A light emitting device, comprising:
 a first light emitting diode (LED) group including at least a blue light LED, the blue light LED emitting light having a dominant wavelength in a range between 400 nm and 480 nm;
 a second LED group including at least a red-orange light LED, the red-orange light LED emitting light having a dominant wavelength in a range between 610 nm and 630 nm;
 a group of luminophor layers located above the first LED group, being able to be excited by a portion of the light emitted by the first LED group to emit light having a dominant wavelength in a range between 500 nm and 555 nm;
 a transparent layer located above the first LED group and the second LED group;
 an anti-reflective coating above the transparent layer; and an input terminal connected to the first LED group and the second LED group, for providing energy to enable the first LED group and the second LED group to emit light;

wherein a mixture of light of the light emitted by the first LED group and fluorescence emitted by exciting the group of luminophor layers falls in an area constructed of six point coordinates and six line segments within the CIE 1931 color space, the six coordinates being sequentially a first point (0.359, 0.481), a second point (0.320, 0.520), a third point (0.220, 0.320), a fourth point (0.260, 0.285), a fifth point (0.359, 0.379), and a sixth point (0.319, 0.399), and the six line segments including a first line segment connecting the first point and the second point, a second line segment connecting the second point and the third point, a third line segment connecting the third point and the fourth point, a fourth line segment connecting the fourth point and the fifth point, a fifth line segment connecting the fifth point and the sixth point, and a sixth line segment connecting the sixth point and the first point.

2. The light emitting device of claim 1, wherein the first LED group is parallelly connected to the second LED group.

3. The light emitting device of claim 1, wherein the first LED group is serially connected to the second LED group.

4. The light emitting device of claim 1, wherein the first LED group and the second LED group include at least an LED unit respectively.

5. The light emitting device of claim 4, wherein the LED units located respectively in the first LED group and the second LED group are parallelly connected.

6. The light emitting device of claim 4, wherein the LED units located respectively in the first LED group and the second LED group are serially connected.

7. The light emitting device of claim 4, wherein the sizes of the LED units located respectively in the first LED group and the second LED group are different.

8. The light emitting device of claim 1, wherein the first LED group and the second LED group are controlled separately.

9. The light emitting device of claim 1, wherein the group of luminophor layers are selected from at least one of silicates, nitrides and oxides.

10. The light emitting device of claim 1, wherein the group of luminophor layers includes at least a fluorescent layer.

11. The light emitting device of claim 1, further comprising a concave structure with a reflective inner surface, the first LED group and the second LED group being disposed on the reflective inner surface of the concave structure, and the reflective inner surface of the concave structure being able to reflect the light emitted by the first LED group, the second LED group and the group of luminophor layers.

12. The light emitting device of claim 1, wherein the anti-reflective coating includes at least one transparent material of nitrocellulose, cellulose esters, cellulose acetate, cellulose acetate butyrate, Teflon, Cytop, $SiO_2$, $SiN_x$, $SiO_xN_y$, $TiO_2$, MgO, or $MgF_2$.

13. The light emitting device of claim 1, wherein the anti-reflective coating is formed by at least one of spin-coating, dip-coating, chemical vapor deposition (CVD), thermal evaporation coating, and e-beam evaporation coating.

14. The light emitting device of claim 1, further comprising:
a diffusion layer located above the first LED group, the second LED group and the group of luminophor layers, enabling the light emitted by the first LED group, the second LED group and the group of luminophor layers to be mixed more uniformly.

15. A light emitting device, comprising:
a base;
a first light emitting diode (LED) group including at least a blue light LED, the blue light LED emitting light having a dominant wavelength in a range between 400 nm and 480 nm;
a second LED group including at least a red-orange light LED, the red-orange light LED emitting light having a dominant wavelength in a range between 610 nm and 630 nm;
a first transparent layer coated on the first LED group and the second LED group;
a group of luminophor layers located above the first transparent layer, being able to be excited by a portion of light emitted by the first LED group to emit light having a dominant wavelength in a range between 500 nm and 555 nm;
an anti-reflective coating disposed between the first transparent layer and the group of luminophor layers; and
an input terminal connected to the first LED group and the second LED group, for providing energy to enable the first LED group and the second LED group to emit light;
wherein a mixture of light of the light emitted by the first LED group and fluorescence emitted by exciting the group of luminophor layers falls in an area constructed of six point coordinates and six line segments within the CIE 1931 color space, the six coordinates being sequentially a first point (0.359, 0.481), a second point (0.320, 0.520), a third point (0.220, 0.320), a fourth point (0.260, 0.285), a fifth point (0.359, 0.379), and a sixth point (0.319, 0.399), and the six line segments including a first line segment connecting the first point and the second point, a second line segment connecting the second point and the third point, a third line segment connecting the third point and the fourth point, a fourth line segment connecting the fourth point and the fifth point, a fifth line segment connecting the fifth point and the sixth point, and a sixth line segment connecting the sixth point and the first point.

16. The light emitting device of claim 15, wherein the base has a reflective surface, the first LED group and the second LED group are disposed on the reflective surface of the base, and the reflective surface reflects light emitted by the first LED group, the second LED group and the group of luminophor layers.

17. The light emitting device of claim 15, wherein the first LED group is parallelly connected to the second LED group.

18. The light emitting device of claim 15, wherein the first LED group is serially connected to the second LED group.

19. The light emitting device of claim 15, wherein the first LED group and the second LED group include at least an LED unit respectively.

20. The light emitting device of claim 19, wherein the LED units located respectively in the first LED group and the second LED group are parallelly connected.

21. The light emitting device of claim 19, wherein the LED units located respectively in the first LED group and the second LED group are serially connected.

22. The light emitting device of claim 19, wherein the LED units located respectively in the first LED group and the second LED group are controlled separately.

23. The light emitting device of claim 15, wherein the first LED group and the second LED group are controlled separately.

24. The light emitting device of claim 23, wherein the surface of the group of luminophor layers is hemispherical, convex, or planar.

25. The light emitting device of claim 15, wherein the group of luminophor layers are selected from one of silicates, nitrides and nitrogen oxides.

26. The light emitting device of claim 15, wherein the group of luminophor layers includes at least a fluorescent layer.

27. The light emitting device of claim 15, wherein the first transparent layer includes at least one transparent material of epoxy, silicone, polyimide, glass, quartz, acryl, polycarbonate (PC), or parylene.

28. The light emitting device of claim 15, wherein the first transparent layer is hemispherical, convex, tapered or Fresnel-lens-shaped.

29. The light emitting device of claim 15, wherein the anti-reflective coating includes at least one transparent material of nitrocellulose, cellulose esters, cellulose acetate, cellulose acetate butyrate, Teflon, Cytop, $SiO_2$, $SiN_x$, $SiO_xN_y$, $TiO_2$, MgO, or $MgF_2$.

30. The light emitting device of claim 15, wherein the anti-reflective coating is formed by at least one of spin-coating, dip-coating, chemical vapor deposition (CVD), thermal evaporation coating, and e-beam evaporation coating.

31. The light emitting device of claim 15, further comprising:
a hollow layer disposed between the first transparent layer and the group of luminophor layers, the thickness of the hollow layer being between 0.01 mm and 10 mm.

32. The light emitting device of claim 31, wherein the hollow layer includes air.

33. The light emitting device of claim 15, further comprising:
a diffusion layer located above the group of luminophor layers, enabling light emitted by the first LED group, the second LED group and the group of luminophor layers to be mixed more uniformly.

34. The light emitting device of claim 33, further comprising:
a second transparent layer disposed between the diffusion layer and the group of luminophor layers, being configured to further protect the group of luminophor layers and a structure thereunder from an influence of moisture.

35. The light emitting device of claim 34, wherein the second transparent layer is hemispherical, convex, tapered or Fresnel-lens-shaped.

36. The light emitting device of claim 15, further comprising a transparent packaging layer located above the group of luminophor layers.

37. The light emitting device of claim 36, wherein the transparent packaging layer includes at least one transparent material of epoxy, silicone, polyimide, glass, quartz, acryl, polycarbonate (PC), or parylene.

38. The light emitting device of claim 36, wherein the transparent packaging layer is hemispherical, convex, tapered or Fresnel-lens-shaped.

39. The light emitting device of claim 15, wherein the base is formed of a semiconductor, a metal, a ceramics or a metal matrix composite.

* * * * *